United States Patent [19]

Refoy et al.

[11] Patent Number: 4,467,391
[45] Date of Patent: Aug. 21, 1984

[54] MONITOR FOR AN ELECTRICALLY-CONTROLLED SYSTEM

[76] Inventors: Brian G. Refoy, 1104 Ridgeway Cir., Richardson, Tex.; Earnest E. Taylor, 3615 Harvard Ave., Dallas, Tex.

[21] Appl. No.: 335,198

[22] Filed: Dec. 28, 1981

[51] Int. Cl.³ .......................................... H01H 47/12
[52] U.S. Cl. .................................. 361/179; 361/187; 49/264
[58] Field of Search ................. 361/179, 187, 188, 85, 361/90, 91, 101; 49/264, 31, 263

[56] References Cited

U.S. PATENT DOCUMENTS

| | | | |
|---|---|---|---|
| 3,662,229 | 5/1972 | Graff et al. | 361/179 |
| 4,021,703 | 5/1977 | Gary et al. | 361/85 |
| 4,122,854 | 10/1978 | Blackett | 361/91 X |
| 4,347,505 | 8/1982 | Anderson | 49/264 X |
| 4,375,073 | 2/1983 | Glogolja et al. | 361/101 X |

Primary Examiner—Reinhard J. Eisenzopf
Attorney, Agent, or Firm—Jerry W. Mills; Gregory M. Howison; Nina Medlock

[57] ABSTRACT

A monitor for an electrically-controlled system is provided. A threshold detector senses the voltage variations in the system by means of an optocoupler. The system is disabled by a relay if a voltage level does not meet a predetermined parameter.

20 Claims, 4 Drawing Figures

MONITOR FOR AN ELECTRICALLY-CONTROLLED SYSTEM

TECHNICAL FIELD

The present invention relates to electronic controls, and more particularly to a monitor for systems where voltage variations exceed predetermined limits.

BACKGROUND ART

A wide variety of systems are controlled by voltage variations, for example, a switch-operated automatic door system. Another example is a system wherein a process parameter actuates a switch to activate a subsequent process step or sound an alarm. In such systems, a control voltage is impressed upon the switch contacts such that when the switch is closed, the control voltage is applied to system components in series with the switch. Ideally, the contact resistance in the switch is infinite when the switch circuit is open and substantially zero when the switch contacts are closed. The voltage across the switch in the open position should be essentially equal to the control voltage, and the voltage across the switch in the closed position should be zero.

Any number of factors can cause the ideal characteristics of the system switch to deteriorate. Environmental effects, for example, may increase the contact resistance in the switch in the closed position and/or decrease the contact resistance in the open position. Such deterioration necessarily operates to decrease the difference in the voltage across the switch in the open and closed positions.

Contact resistance deterioration can lead to unsafe operating conditions in such systems. For example, in an automatic door system a control mat is placed in the doorway to actuate a door control unit to open the door. A safety mat is disposed after the door to hold the door open while a person is passing through the doorway. If the switch under the safety mat has deteriorated or become inoperative, the door may close while the person is on the safety mat and thereby cause injury to the person. By way of further example, in an industrial process where a switch is employed to trigger a safety alarm, as the switch contacts reach a certain degree of deterioration, the alarm will not be activated when the dangerous condition is sensed.

It can therefore be seen that there exists a need in many environments for a monitor for sensing voltage variations. Such a monitor could, for example, monitor the contact resistance across a switch, and disable the switch-controlled system when the variation in switch resistance between the open and closed positions of the switch exceeds an acceptable limit.

SUMMARY OF THE INVENTION

In accordance with the present invention, a monitor for sensing voltage variations in an electrically-controlled system is provided. An electrical characteristic such as a voltage across the switch in the open or closed position is sensed and compared to a predetermined parameter, such as a voltage limit or threshold. The system is disabled if the sensed electrical characteristic does not meet the predetermined parameter. The disabled system is then either deactivated completely or bypassed such that alternate equipment is activated.

In accordance with a specific aspect of the invention, a monitor for an automatic doorway includes means for sensing voltage variations across a switch operated by a safety mat. The automatic doorway is disabled if the voltage drop across the safety mat switch in the open or closed position does not meet a predetermined threshold.

In accordance with another aspect of the invention, a method of monitoring an electrically-controlled system is provided. The method includes sensing voltage variations in the system and disabling the system if the sensed voltage variations do not meet a predetermined parameter. After the disabling step, the system may be either completely deactivated or bypassed such that alternate equipment is activated.

BRIEF DESCRIPTION OF DRAWINGS

A more complete understanding of the present invention and its advantages will be apparent from the following detailed description taken in conjunction with the accompanying drawings in which.

DETAILED DESCRIPTION

Figure 1:
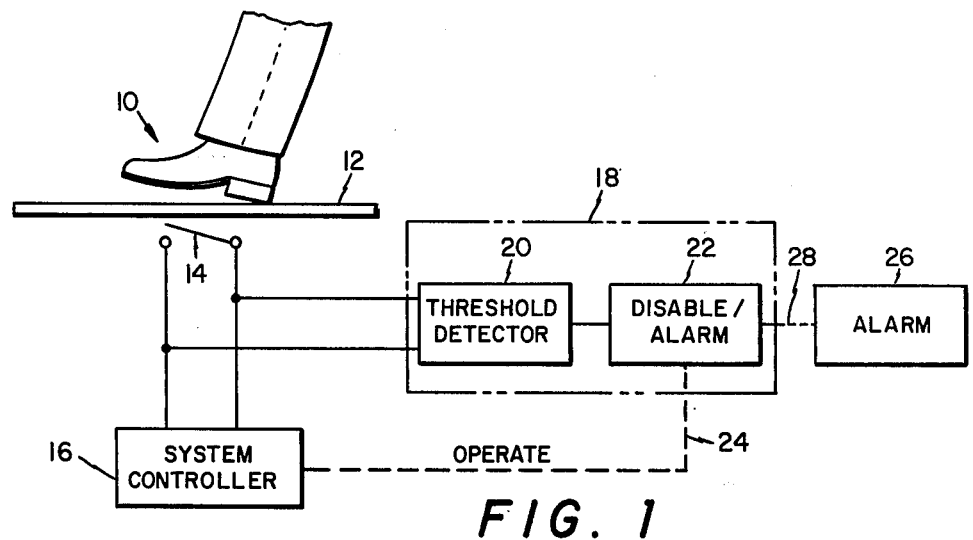
FIG. 1 is a diagrammatic view of the monitor of the present invention.

Referring initially to FIG. 1, the preferred embodiment of an automatic door system is shown as the environment of the monitor of the present invention. Although the present invention is particularly useful as a monitor for automatic doors, it is to be understood that the invention is not limited to use with such devices, and may be used with any electrically-controlled system. Foot 10 stepping on safety mat 12 operates to open and close system switch 14. Switch 14 is connected in parallel to system controller 16 and safety monitor 18. Safety monitor 18 includes threshold detector 20 and disable/alarm unit 22.

In operation, threshold detector 20 continuously monitors the voltage, and therefore contact resistance, across switch 14. As long as the variation between voltage in the open and closed positions of switch 14 exceeds a predetermined value, disable/alarm unit 22 provides an operate signal to system controller 16 over line 24. In the event the voltage variation drops below the threshold, however, the operate signal changes to disable the system. It will be understood that the word "disable" used in this specification and the claims which follow includes either a complete deactivation of the system or a bypassing of the system such that alternate equipment is activated.

Alternatively, threshold detector 22 may compare the open position voltage against a predetermined upper threshold or compare the closed position voltage against a lower threshold, or both. The system is disabled if the threshold comparisons indicate insufficient open position contact resistance or excessive closed position contact resistance.

In certain embodiments, it may be desirable to provide alarm 26 connected to disable/alarm unit 22 by line 28 to sound when the system is disabled.

Figure 2A:
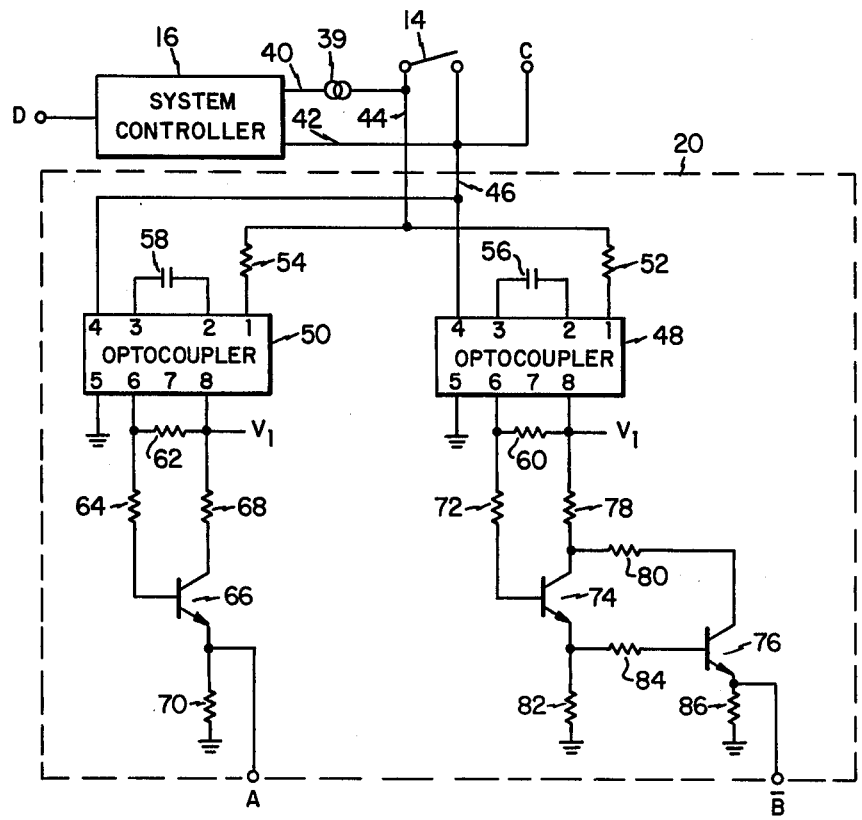
FIGS. 2A and 2B are schematic diagrams of the threshold detector and disable/alarm unit of FIG. 1.
Figure 2B:
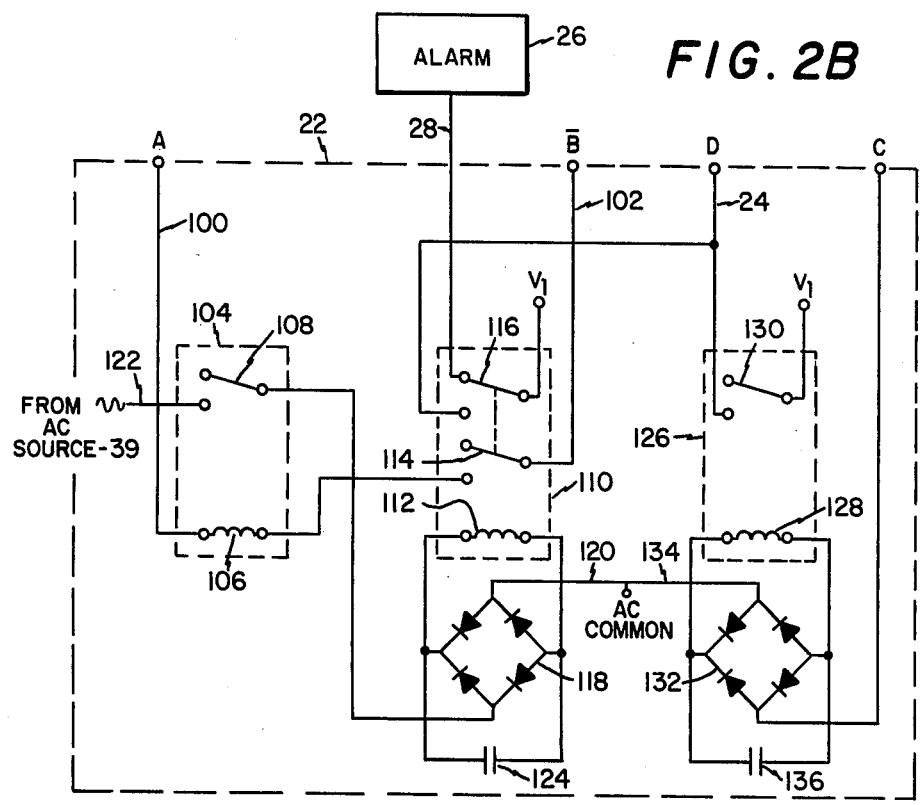

FIGS. 2A and 2B illustrate a circuit adapted to function as described above in conjunction with FIG. 1. As described in more detail below, the circuits of FIGS. 2A and 2B are connected at points A and $\overline{B}$, and the circuit of FIG. 2B is connected to system controller 16 at points C and D. Referring initially to FIG. 2A, which illustrates threshold detector 20, an alternating current control voltage generated by alternating current source 39 is applied to system controller 16 through lines 40, switch 14 and line 42. Threshold detector 20 is connected across switch 14 by lines 44 and 46. In preferred form, the threshold detector 20 includes interface optocouplers 48 and 50, which are manufactured by Hewlett Packard and are designated by the number HCPL-3700. Optocouplers 48 and 50 each comprises an integrated circuit having an internal light emitting diode and photon detector to provide an optocoupler having adjustable external threshold levels. The optocouplers are connected in parallel to lines 44 and 46. Line 46 is connected to pins 4 on optocouplers 48 and 50, and line 44 is connected to resistor 52 at pin 1 of optocoupler 48 and resistor 54 at pin 1 of optocoupler 50. Capacitors 56 and 58 are connected to pins 2 and 3 of optocouplers 48 and 50 respectively. Pins 5 are grounded and pin 7 is nonfunctional. Pins 8 are connected to a conventional direct current power supply (not shown) which provides a voltage $V_1$ of approximately 5 volts. Pins 8 are also connected to pins 6 through resistor 60 at optocoupler 48 and resistor 62 at optocoupler 50.

Pin 6 of optocoupler 50 is connected through resistor 64 to the base of transistor 66. $V_1$ is connected through resistor 68 to the collector of transistor 66. The emitter of transistor 66 is connected to ground through resistor 70 and provides a sensing logic signal at point A.

Pin 6 of optocoupler 48 is connected through resistor 72 to the base of transistor 74. $V_1$ is connected to the collectors of transistors 74 and 76 through resistors 78 and 80 respectively. The emitter of transistor 74 is grounded through resistor 82 and provides a signal at point $\overline{B}$. Resistor 84 connects the base of transistor 76. The emitter of transistor 76 is grounded through resistor 86 and provides a sensing logic signal at point $\overline{B}$.

Referring now to FIG. 2B, disable/alarm unit 22 may be more clearly understood. Logic signals from point A and point $\overline{B}$ enter the disable/alarm unit from threshold detector 20 through lines 100 and 102 respectively. Disable/alarm unit 22 includes first relay 104 having first relay coil 106 and first relay switch 108. Second relay 110 includes second relay coil 112, second relay switch 114, and alarm/disable switch 116. First relay coil 106 and second relay switch 114 are connected in series to lines 100 and 102. Alarm/disable switch 116 is connected in the open position to line 28 and alarm 26, and in the closed position to system controller 16 through line 24. First and second relays 104 and 110 are of the "normally open" type, such that when first and second relay coils 106 and 112 are not energized, switches 108, 114 and 116 are open. When coils 106 and 112 are energized, switches 108, 114 and 116 shift to a closed position.

First relay switch 108 is connected in series with rectifier bridge 118. Switch 108 serves to connect the alternating current control voltage from source 39 to bridge 118 through lines 120 and 122. The direct current output of rectifier bridge 118 is connected in parallel to second relay coil 112 and capacitor 124.

Alarm/disable unit further includes third relay 126 having third relay coil 128 and third relay switch 130. Disable/alarm switch 116 connects line 128 to $V_1$ in the open position and line 24 to $V_1$ in the closed position. Third relay switch 130 connects point D of line 24 to $V_1$ in the closed position. As shown in FIGS. 1 and 2A, point D transmits an "operate" signal to system controller 16. Rectifier bridge 132 is connected to the alternating current control voltage through line 134 and system switch 14 at point C, as shown in FIG. 2A. The direct current output of rectifier bridge 132 is connected in parallel to third relay coil 128 and capacitor 136.

In operation, switch 14 operates to supply the alternating current control voltage to system controller 16. The switch contacts of switch 14 are connected in parallel to optocouplers 48 and 50. In the preferred embodiment, where optocouplers 48 and 50 are each a Hewlett Packard HCPL-3700 device, pins 1 and 4 are the alternating current input pins and pins 2 and 3 are the direct current input pins. In the embodiment shown in FIG. 1, the switch to be monitored is used in an alternating current circuit, so pins 1 and 4 are used. It will be readily appreciated that in direct current systems, pins 2 and 3 may be used. Resistors 52 and 54 are chosen to attenuate the optocoupler inputs such that optocoupler 48 has a lower threshold than optocoupler 50. When the voltage across optocoupler 48 is above the threshold set by resistor 52, pin 6 is at a low logic state. When the voltage is less than the threshold, pin 6 goes to a high logic state. Similarly, when the voltage across switch 14 is above the threshold set by resistor 54, pin 6 of optocoupler 50 goes low. When the voltage is less than the threshold of optocoupler 50, pin 6 goes high.

The output of optocoupler 50 is amplified and buffered by transistor 66, such that the amplified output of optocoupler 50 appears at point A. In a similar manner, the output of optocoupler 48 is amplified and buffered by transistor 74. The amplified output is then inverted by transistor 76 such that the inverted output of optocoupler 48 appears at point $\overline{B}$.

Figure 3:
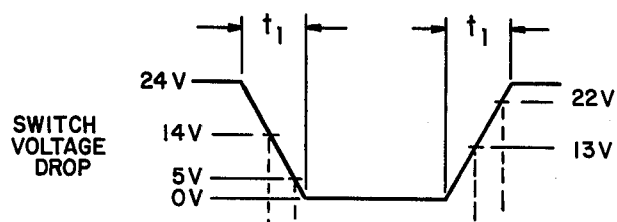
FIG. 3 is a phase diagram illustrating the operation of the present invention.
Figure 3:
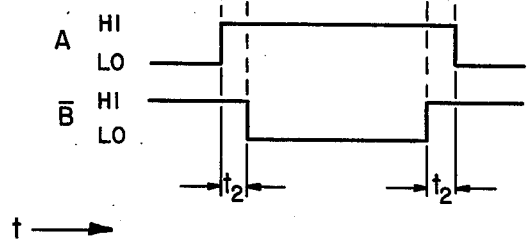

A phase diagram of threshold detector 20 is shown in FIG. 3. The optocouplers have build-in hysteresis, such that in a 24 volt system the negative-going threshold is approximately 8 volts lower than the positive-going threshold. Thus, in FIG. 3, which illustrates an open-close-open cycle of switch 14, when switch 14 is opened a voltage of 24 volts is sensed. When the switch is closed, the voltage drops to 0 volts over a time period $t_1$. When the voltage equals 14 volts, optocoupler 50 turns point A to logic state high. When the voltage equals 5 volts, optocoupler 48, its output inverted by transistor 76, turns point $\overline{B}$ to logic state low. Between 14 volts and 5 volts, however, point $\overline{B}$ is at a high logic state, and thus points A and $\overline{B}$ are in phase. Thus it can be seen that at voltages higher than 14 volts and voltages lower than 5 volts, points A and $\overline{B}$ are out of phase. As shown in FIG. 3, points A and $\overline{B}$ are in phase for a time period $t_2$. Due to hysteresis, the thresholds of the opto-isolators when switch 14 goes from a closed to open position are shifted upwards by approximately 8 volts. Therefore, at 13 volts point $\overline{B}$ shifts to a high logic state and is in phase with point A for a time period $t_2$ until the voltage reaches 22 volts, where point A returns to a low logic state.

Thus it can be seen that as long as the voltage across switch 14 in the open position is greater than 22 volts and in the closed position is less than 5 volts, the maximum period of time in which points A and $\overline{B}$ will be in phase is $t_2$. If in the closed position the voltage is below 14 volts, but not below 5 volts, then points A and $\overline{B}$ will be in phase when the switch is in the closed position. In similar manner, if the open position voltage exceeds 13 volts but not 22 volts, points A and $\overline{B}$ will be in phase when the switch is in the open position. Thus it can be seen that, to keep points A and $\overline{B}$ out of phase, the voltage must be above an upper voltage threshold of 22 volts in the open position and below a lower voltage threshold of 5 volts in the closed position. Stated differently, the open and closed voltages must vary by more than 17 (22 minus 5) volts to keep points A and $\bar{B}$ out of phase. Of course, the 24 volt system of the present invention, with voltage thresholds of 22 volts and 5 volts, is by way of illustration only. The operating system voltage and threshold voltages may be changed to adapt the invention to be used in any system by the selection of attenuation resistors 52 and 54.

Disable/alarm unit 22 is designed to sense when signals A and $\bar{B}$ have been in phase for a time period greater than $t_2$. As explained above, this occurrence indicates that either the open voltage is less than 22 volts or the closed voltage is greater than 5 volts, or both. Disable/alarm unit 22 is initialized to an operate mode by holding first relay switch 108 and second relay switch 114 in the closed position while points A and $\bar{B}$ are out of phase. Thereafter the system operates automatically until shifted to a disabled mode.

First relay coil 106 is energized whenever points A and $\bar{B}$ are out of phase, because when point A is high and $\bar{B}$ is low, current flows through coil 106 from point A to point $\bar{B}$ to ground. Conversely, when point $\bar{B}$ is high and point A is low, current flows from point $\bar{B}$ through switch 114 and relay coil 106 to point A to ground. Whenever points A and $\bar{B}$ are in phase, whether both high or both low, coil 106 is not energized and switch 108 opens.

Normally, $t_2$ is the maximum time period that the open and closed voltages are within the window set by the upper and lower thresholds. Thus, signals A and $\bar{B}$ are in phase and switch 108 is open for in normal operation time periods of $t_2$ or less. Capacitor 124 is chosen such that second relay coil 112 remains energized by the discharge of capacitor 124 while switch 108 is open, as long as such time period does not exceed $t_2$ by a certain safety margin. Thus, under normal operating conditions, the brief periods of time in which switch 108 is open does not operate to open switch 114 or switch 116. Accordingly, switch 114 is held closed while points A and $\bar{B}$ are briefly in phase to allow subsequent re-energization of first relay coil 106 when points A and $\bar{B}$ once again are out of phase. Switch 116 is held in the closed position such that an operate signal is continuously supplied through line 24 and point D to system controller 16, thereby maintaining the system in an operative mode.

When threshold detector 20 detects voltages within the threshold window for periods longer than the time limit set by capacitor 124, switches 114 and 116 shift to the open position. Points A and $\bar{B}$ becoming subsequently out of phase cannot re-energize relay coil 106 because of the open position of switch 114. Switch 116 in the open position operates to sound alarm 26 by applying voltage $V_1$ to line 28. Thus it can be seen that capacitor 124 acts to delay the disabling of the system when points A and $\bar{B}$ are in phase for time periods less than or equal to a certain time limit period, chosen to reflect the switch characteristic $t_2$. In practice, a time limit of one half second has been found to give good results.

An additional safety feature is accomplished by powering second relay coil 112 by the rectified alternating current control signal. In case of a power failure, relay coil 112 becomes de-energized, and the system becomes disabled.

In some embodiments it may be desirable to delay the disabling of the system while the system is in use. For example, in the automatic door environment the system controller should remain in an operate mode, even if a threshold fault has been detected, as long as a person is stepping on mat 12 and closing switch 14. Otherwise, the safety monitor shifting to the disable mode could close the door on the person. This result is prevented by providing optional in-use relay 126.

While switch 14 is closed, control voltage is applied through point C to rectifier bridge 132 thereby energizing third relay coil 128. The energization of coil 128 closes switch 130 providing an operate signal to the system controller through point D. If the threshold detector and disable/alarm unit have meanwhile shifted to the disable mode, the system controller remains in the operative mode until the person steps off mat 12 and opens switch 14. Capacitor 136 may be added to further delay the disabling of the system, thereby affording a greater safety margin.

While the present invention has been described in connection with the details of particular embodiments thereof, it should be understood that these details are not intended to be limative of the invention since many modifications will be readily apparent to those skilled in this art. It is, therefore, contemplated in the accompanying claims to cover any such modifications as fall witin the true spirit and scope of the invention.

We claim:
1. A monitor for an electrically controlled system comprising:
   (a) a switch having a voltage impressed thereacross;
   (b) means for sensing the voltage signal across said switch in the open and closed positions; and
   (c) means for disabling the electrically-controlled system if said sensed voltage signal in one of either the open or closed positions does not vary from the sensed voltage level in the other of the closed and open positions by a predetermined voltage limit.
2. The monitor of claim 1 wherein
   said means for disabling the electrically-controlled system disables the system if said sensed voltage level in the closed position is greater than a predetermined lower threshold.
3. The monitor of claims 1 or 2 further comprising means for delaying said means for disabling if said switch is in the closed position until saidswitch is in the open position.
4. The monitor of claim 1 wherein said means for sensing said voltage signal includes an optocoupler to generate logic signals on the output thereof representative of a level of said voltage signal relative a voltage threshold.
5. The monitor of claim 1 wherein:
   (a) said means for sensing said voltage signal includes first and second optocouplers;
   (b) said first optocoupler being adapted to generate a first logic signal on the output thereof representative of a first level of said voltage signal relative an upper voltage threshold;
   (c) said second optocoupler being adapted to generate a second logic signal on the output thereof representative of a second level of said signal relative a lower voltage threshold said second logic level having the opposite logic state of said first logic signal;
   (d) said upper voltage threshold being greater than said lower voltage threshold;

(e) means for comparing the logic states of said first and second logic signals and generating an output signal when said first and second logic signals are out of phase and have the same logic state;

(f) time delay means for establishing a predetermined time limit and generating a disabling signal when said output signal is present for said predetermined time limit; and (g) said means for disabling the system responding to said disabling signal, such that said system is disabled when said first voltage level is less than said upper voltage threshold or when said second voltage level is greater than said lower voltage threshold.

6. The monitor of claim 5 further including means for amplifying said first and second logic signals.

7. The monitor of claim 5 wherein said means for disabling comprises a relay.

8. The monitor of claim 1 further comprising means for energizing an alarm when said system is disabled.

9. A monitor for a system controlled by a switch having conducting and non-conducting positions, comprising:

(a) first and second sensing means connected to the switch for sensing voltages across the switch in the conducting and non-conducting positions;

(b) said first sensing means shifting a first sensing signal to a different logic state when said sensed voltage is less than a first predetermined threshold;

(c) said second sensing means shifting a second sensing signal to a different logic state when said sensed voltage is less than a second predetermined threshold;

(d) said first and second sensing signals being out of phase when said sensed voltage is greater than said first threshold or less than said second threshold, but in phase when said voltage is between said first and second thresholds;

(e) means for generating a phase signal when said first and second signals are in phase;

(f) timing means for generating a disabling signal after said phase signal has been present for a predetermined interval of time; and (g) means for disabling the system in response to said disabling signal when said first and second sensing signals are in phase for a time period longer than said predetermined time interval.

10. The monitor of claim 9 wherein said first and second means for sensing each comprises an optocoupler.

11. The monitor of claim 10 further including a first transistor for amplifying said first sensing signal, a second transistor for amplifying said second sensing signal, and means for inverting said second sensing signal.

12. The monitor of claim 11 wherein said means for disabling comprises:

(b) a first relay having a coil and a normally open relay switch, said coil being connected to said first and second sensing signals amplified by said first and second transistors, such that when said sensing signals are out of phase said first relay is energized and said first relay switch is closed; and (b) a second relay having a second relay coil and a normally open second relay switch disposed to disable the system in the open position and maintain the system in the operative mode in the closed position;

(c) said second relay coil being connected in series to a first direct current source controlled by said first relay switch, such that when said first relay switch is closed, said second relay coil is energized and said second relay switch is closed; and (d) a capacitor connected across said second relay coil to maintain said second relay coil energized for a predetermined time period when said first relay switch is open, such that a time limit for in phase first and second sensing signals is established.

13. The monitor of claim 12 wherein said first direct current source is a rectifier bridge connected in series to said first relay switch and to an alternating current control voltage.

14. The monitor of claim 12 further comprising an in-use relay having a third relay coil and a normally open third relay switch, said third relay coil being connected in series to a second direct current source controlled by the system switch, and said third relay switch being disposed to maintain the system in an operative mode in the closed position, thereby delaying said means for disabling until said system switch is in the open position.

15. The monitor of claim 14 wherein said second direct current source is a rectifier bridge connected in series to said system switch and to an alternating current control voltage.

16. The monitor of claim 15 further comprising a delay capacitor connected across said third relay coil.

17. An automatic doorway system comprising:

(a) a system controller for controlling the automatic doorway system;

(b) a switch connected to said system controller and operated by a safety mat, said switch having an open position for a non-conducting state and a closed position for a conducting state;

(c) first and second means connected across said switch for sensing voltage drops across said switch;

(d) said first sensing means shifting a first sensing signal to a different logic state when said voltage drop is less than a first predetermined threshold;

(e) said second sensing means shifting a second sensing signal to a different logic state when said voltage drop is less than a second predetermined threshold;

(f) said first and second sensing means shifting said first and second sensing signals, respectively, when said switch is properly operating;

(g) said first and second sensing signals being out of phase when said voltage drop is greater than said first threshold or less than said second threshold, but in phase when said voltage drop is between said first and second thresholds;

(h) means for generating an in phase signal when said first and second sensing signals are in phase;

(i) timing means for generating a disabling signal after said in phase signal has been present for a predetermined interval of time; and (j) means for disabling the system in response to said disabling signal when said first and second sensing signals are in phase for a time period longer than said predetermined time interval.

18. A method of monitoring voltage variations in an electrically-controlled system, comprising the steps of:

(a) sensing the voltage variations across a switch in both the conducting state and the non-conducting state of the switch;

(b) generating a first sense signal having two states that changes states when the voltage across the switch exceeds a first threshold;

(c) generating a second sense signal having two states that changes states when the voltage across the switch exceeds a second threshold;

(d) generating a fault signal when only one of the first or second sense signals does not change state, a change of states in both of the sense signals inhibiting generation of the fault signals;

(e) generating a disabling signal after the fault signal is present for a predetermined interval of time; and (f) disabling the electrically-controlled system in response to the disabling signal.

19. The method of claim 18 wherein said sensing step includes generating by means of an optocoupler a logic signal representative of a voltage level relative a voltage threshold.

20. The method of claim 19 wherein said step of disabling includes detecting an out of phase relationship of logic signals representative of the voltage variations.

* * * * *